United States Patent
Yamanaka et al.

(10) Patent No.: US 9,622,383 B2
(45) Date of Patent: Apr. 11, 2017

(54) HEAT RADIATION STRUCTURE OF ELECTRIC DEVICE AND METHOD FOR MANUFACTURING THE SAME

(71) Applicant: DENSO CORPORATION, Kariya, Aichi-pref. (JP)

(72) Inventors: Takahiro Yamanaka, Kariya (JP); Yoshimichi Hara, Kuwana (JP); Toshihisa Yamamoto, Anjo (JP); Kouji Kameyama, Anjo (JP); Yuuji Kobayashi, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 391 days.

(21) Appl. No.: 14/167,007

(22) Filed: Jan. 29, 2014

(65) Prior Publication Data

US 2014/0218869 A1    Aug. 7, 2014

(30) Foreign Application Priority Data

Feb. 5, 2013    (JP) .................................. 2013-20425

(51) Int. Cl.
*H05K 7/20*    (2006.01)
*H05K 3/00*    (2006.01)
(Continued)

(52) U.S. Cl.
CPC ....... *H05K 7/2039* (2013.01); *H01L 23/3677* (2013.01); *H01L 23/3735* (2013.01);
(Continued)

(58) Field of Classification Search
CPC ...... H05K 1/0265; H05K 1/0298; H05K 1/02; H05K 1/18; H05K 1/0201–1/0212;
(Continued)

(56) References Cited

U.S. PATENT DOCUMENTS 4,850,233 A    7/1989    Ishigo
6,724,638 B1 *    4/2004    Inagaki ............... H01L 21/4857
                                                257/E23.062

(Continued)

FOREIGN PATENT DOCUMENTS

JP    2004-158545    6/2004
JP    2009-088339    4/2009

OTHER PUBLICATIONS

Office Action (1 page) dated Dec. 16, 2014 issued in corresponding Japanese Application No. 2013-020425 and English translation (3 pages).

*Primary Examiner* — Zachary M Pape
*Assistant Examiner* — Amir Jalali
(74) *Attorney, Agent, or Firm* — Nixon & Vanderhye P.C.

(57) ABSTRACT

A heat radiation structure for an electric device includes: at least one multi-layer substrate including a plurality of base parts made of insulation material and a conductor pattern, which are stacked in a multi-layer structure so that the conductor pattern is electrically coupled with an interlayer connection portion in the base parts; the electric device having at least one of a first electric element built in the at least one multi-layer substrate and a second electric element, which is not built in the multi-layer substrate; and a low heat resistance element opposed to the electric device. The low heat resistance element has a heat resistance lower than the insulation material.

9 Claims, 10 Drawing Sheets

(51) Int. Cl.
*H05K 3/10* (2006.01)
*H05K 3/22* (2006.01)
*H05K 3/30* (2006.01)
*H02M 7/00* (2006.01)
*H05K 1/02* (2006.01)
*H01L 23/367* (2006.01)
*H01L 23/373* (2006.01)
*H05K 3/46* (2006.01)
*H01L 23/538* (2006.01)
*H05K 1/18* (2006.01)

(52) U.S. Cl.
CPC .......... *H02M 7/003* (2013.01); *H05K 1/0265* (2013.01); *H05K 3/0058* (2013.01); *H05K 3/10* (2013.01); *H05K 3/22* (2013.01); *H05K 3/303* (2013.01); *H05K 7/209* (2013.01); *H01L 23/5389* (2013.01); *H01L 2924/0002* (2013.01); *H05K 1/185* (2013.01); *H05K 3/4614* (2013.01); *H05K 2201/10166* (2013.01); *Y10T 29/49126* (2015.01); *Y10T 29/49139* (2015.01); *Y10T 29/49155* (2015.01); *Y10T 29/49165* (2015.01)

(58) Field of Classification Search
CPC ........ H05K 1/185; H05K 3/0058; H05K 3/10; H05K 3/0011; H05K 3/22; H05K 3/303; H05K 3/30; H05K 3/4614; H05K 7/209; H05K 7/205; H05K 2201/10098; H05K 2201/06; H05K 2201/10416; H05K 2201/10166; H01L 23/5389; H01L 23/34–23/4735; H01L 2924/0002; H02M 7/003; H01Q 1/12; H01Q 1/18; Y10T 29/49126; Y10T 29/49139; Y10T 29/49155; Y10T 29/49165
USPC .......... 361/719–722, 764; 174/252; 257/713, 257/720; 343/787; 29/600, 841
See application file for complete search history.

(56) References Cited

U.S. PATENT DOCUMENTS

| | | | | |
|---|---|---|---|---|
| 6,943,443 | B2* | 9/2005 | Nobori | H01L 23/492 257/668 |
| 6,958,535 | B2* | 10/2005 | Hirano | H01L 23/3737 257/668 |
| 7,042,081 | B2* | 5/2006 | Wakisaka | H01L 23/3128 257/700 |
| 7,217,998 | B2* | 5/2007 | Tamagawa | H01L 23/36 257/707 |
| 8,350,388 | B2* | 1/2013 | Sasaoka | H01L 23/5389 257/723 |
| 8,730,429 | B2* | 5/2014 | Lee | G02F 1/133385 349/161 |
| 9,192,049 | B2* | 11/2015 | Denda | H05K 1/115 |
| 2003/0094697 | A1* | 5/2003 | Higashida | H01L 23/5387 257/758 |
| 2003/0097750 | A1* | 5/2003 | Okabe | H01L 21/4857 29/847 |
| 2003/0173105 | A1* | 9/2003 | Kondo | H05K 3/4691 174/255 |
| 2004/0070946 | A1* | 4/2004 | Matsuo | H01L 23/24 361/709 |
| 2004/0154163 | A1* | 8/2004 | Miyazaki | H01L 23/3107 29/832 |
| 2004/0229024 | A1* | 11/2004 | Harada | H05K 1/0242 428/209 |
| 2005/0217893 | A1* | 10/2005 | Noguchi | H05K 1/162 174/250 |
| 2006/0278963 | A1* | 12/2006 | Harada | H05K 1/0265 257/668 |
| 2007/0252270 | A1* | 11/2007 | Takano | H01L 25/16 257/723 |
| 2009/0154132 | A1* | 6/2009 | Okamoto | H01L 23/5389 361/804 |
| 2009/0260858 | A1* | 10/2009 | Nakai | H05K 1/0206 174/252 |
| 2010/0025082 | A1 | 2/2010 | Sasaoka et al. | |
| 2015/0223317 | A1* | 8/2015 | Oi | H05K 1/181 361/709 |

* cited by examiner

HEAT RADIATION STRUCTURE OF ELECTRIC DEVICE AND METHOD FOR MANUFACTURING THE SAME

CROSS REFERENCE TO RELATED APPLICATION

This application is based on Japanese Patent Application No. 2013-20425 filed on Feb. 5, 2013, the disclosure of which is incorporated herein by reference.

TECHNICAL FIELD

The present disclosure relates to a heat radiation structure of an electric device for radiating heat in the electric element and a method for manufacturing the heat radiation structure.

BACKGROUND

Conventionally, a technique relating to a multi-layer substrate, which has excellent heat radiation property of a semiconductor element and has a low manufacturing cost, is disclosed in, for example, JP-A-2004-158545. The multi-layer substrate includes a heat radiation plate, which is disposed on both sides in an upper-lower direction and is insulated from the semiconductor element.

However, in a heat radiation structure of the semiconductor element such as a MOS-FET (i.e., metal oxide semiconductor field effect transistor), which provides a motor driving circuit, a surface mounting element such as a SMD (i.e., surface mount device) and a bare chip including a package is mounted on a surface of a substrate, and a back surface of the substrate contacts the heat radiation body so as to radiate heat. In this structure, no element is mounted on the back surface. Further, since the heat is radiated via the substrate, the heat radiation efficiency is not good.

Alternatively, a structure is proposed such that a surface mounted element having a heat radiation surface opposite to a substrate mounting surface is used, and the heat radiation surface of the surface mounted element contacts a heat radiation plate via a heat conducting member. When multiple surface mounted elements are mounted on the substrate, and a heat radiation body is attached, if the thickness (i.e., a height) of each surface mounted element is varied, the thickness of the heat conducting member is also varied. Further, since the heat radiation body is an electric conductor in general, it is necessary to secure the insulating property between the heat radiation body and the surface mounted element with the heat conducting member. Thus, it is necessary to secure the insulating property between the surface mounted element having the smallest thickness and the heat radiation body with the heat conducting member and to design thermally in view of the surface mounted element with the heat conducting member having the largest thickness. Accordingly, it is necessary to use the heat conducting member having high performance, compared with a case where a single item is attached to the heat radiation body.

The above difficulties also arise in the multi-layer substrate described in JP-A-2004-158545.

SUMMARY

It is an object of the present disclosure to provide a heat radiation structure of an electric device having high heat radiation performance of the electric element. Further, even when the heat radiation structure includes multiple layers having different thicknesses and multiple electric elements having different heights, a gap in the multi-layer substrate is easily controlled.

According to a first aspect of the present disclosure, a heat radiation structure for an electric device includes: at least one multi-layer substrate including a plurality of base parts made of insulation material and a conductor pattern, which are stacked in a multi-layer structure so that the conductor pattern is electrically coupled with an interlayer connection portion in the base parts; the electric device having at least one of a first electric element built in the at least one multi-layer substrate and a second electric element, which is not built in the multi-layer substrate; and a low heat resistance element opposed to the electric device. The low heat resistance element has a heat resistance lower than the insulation material.

In the above structure, the low heat resistance element is arranged to face multiple electric elements even when the electric elements are accommodated in the multi-layer substrate. Even when the initial height or the initial thickness of the multi-layer substrate and the electric element are different from each other, the height or the thickness are equalized by the heating and pressing process. Thus, the clearance in the structure is easily controller. Further, since the low heat resistance element has the low heat resistance, the heat generated at the electric element is transmitted. Thus, the heat radiation performance of the electric element is improved.

According to a second aspect of the present disclosure, a method for manufacturing a heat radiation structure for an electric device includes: forming a conductor pattern on one of or both of surfaces of each base part, which is made of insulation material; forming a via hole at a predetermined position of each base part; filling the via hole with an interlayer connection member; accommodating a first electric element in an accommodation portion of one of the base parts, the first electric element being included in the electric device; stacking a plurality of base parts so as to form a stacked body; heating and pressing the stacked body with a press die so that the base parts are bonded to each other so as to form a multi-layer substrate; and heating and press-bonding a low heat resistance element on one surface of at least one multi-layer substrate via a heat conducting member, or arranging and heating the low heat resistance element directly on one surface of at least one multi-layer substrate.

In the above method, since the heating and press-bonding of the low heat resistance element or the arranging and heating of the low heat resistance element is performed, the low heat resistance element is arranged to face multiple electric elements including the electric element in the multi-layer substrate. Even when the initial height or the initial thickness of the multi-layer substrate and the electric element are different from each other, the height or the thickness are equalized by the heating and pressing process. Thus, the clearance in the structure is easily controller. Further, since the low heat resistance element has the low heat resistance, the heat generated at the electric element is transmitted. Thus, the heat radiation performance of the electric element is improved.

According to a third aspect of the present disclosure, a method for manufacturing a heat radiation structure for an electric device includes: arranging a plurality of electric elements on a circuit board along a stacking direction of the electric elements and the circuit board; and arranging, heating and bonding a low heat resistance element on the plurality of electric elements via a heat conducting member opposite to the circuit board.

In the above method, even when the initial height of multiple electric elements arranged along the direction different from the stacking direction are different from each other, the height are equalized by the heating and pressing process. Thus, the clearance in the structure is easily controller. Further, since the low heat resistance element has the low heat resistance, the heat generated at the electric element is transmitted. Thus, the heat radiation performance of the electric element is improved.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
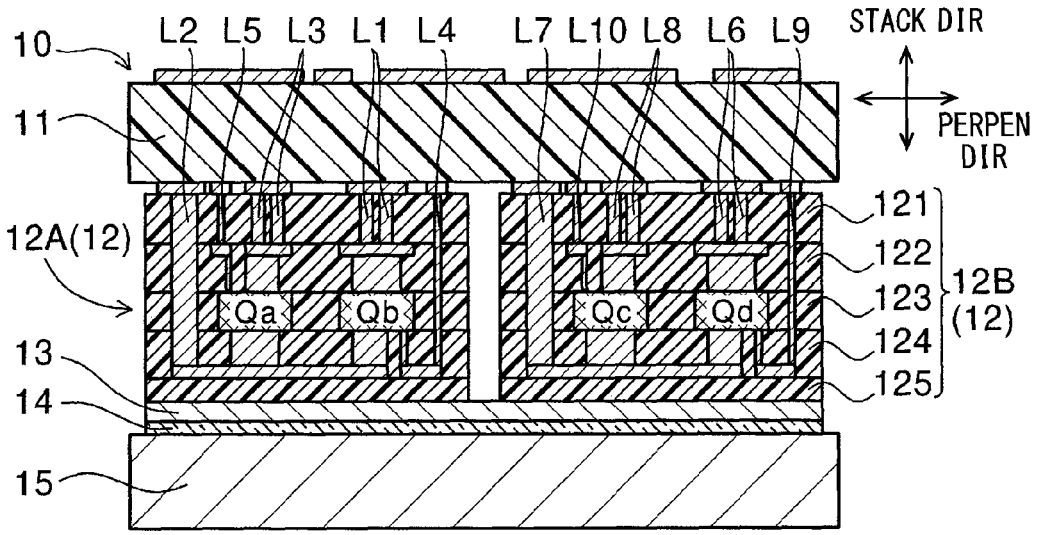
FIG. 1 is a diagram showing a cross sectional view of a heat radiation structure of an electric element according to a first embodiment.

Embodiments will be explained with reference to the drawings. Here, the word "connecting" means an electrical connection. Right, left, up and down directions are defined in the drawings. The sign "-" represents continuity of numbers or alphabets. For example, the words "base parts 121-125" represents "base parts 121, 122, 123, 124, 125." Similarly, the words "semiconductor elements Qa-Qd" represents "semiconductor elements Qa, Qb, Qc, Qd." The heat radiation structure of the electric element is simply defined as the heat radiation structure.

First Embodiment

A heat radiation structure according to a first embodiment includes multiple multi-layer substrates between a circuit board and a heat radiation body. The structure will be explained with reference to FIGS. 1 to 8. The heat radiation structure 10 shown in FIG. 1 includes the circuit board 11, multiple multi-layer substrates 12, a low heat resistance element 13, a heat conducting element 14 and a heat radiation body 15. In the present embodiment, multiple multi-layer substrates 12 include a first multi-layer substrate 12A and a second multi-layer substrate 12B.

The circuit board 11 is a board, on which the electric element is mounted, and a conductor pattern is formed. In the present embodiment, the circuit board 11 provides to control the electric rotating machine 20 having three phases such as a U-phase, a V-phase and a W-phase. Specifically, the circuit board 11 includes a control circuit 30, resistors Ru, Rv, Rw, capacitors Cu, Cv, Cw, semiconductor elements Q1-Q6, Q11-Q15 and the like. Here, a part of the semiconductor elements Q1-Q15 are built in the multi-layer substrates 12A, 12B.

The electric rotating machine 20 may be any kind of machines as long as the machine 20 includes a rotating member such as a shaft or a rod. For example, the machine 20 may be a generator, an electric motor, or an electric motor generator. The control circuit 30 transmits signals such as a PWM signal to the semiconductor elements Q1-Q6 so that the circuit 30 controls the elements Q1-Q6 to turn on and off. Thus, this control function provides to convert electricity, which is supplied from an electric power source E via a filter circuit having a coil Le and a capacitor Ce, so that the electricity is supplied to the rotating machine 20 as a load. The electric power source E may be a battery such as a secondary battery or a fuel battery. When the power source E is the secondary battery, the regeneration electricity generated at the rotating machine 20 is accumulated in the electric power source E via a diode.

In the multi-layer substrates 12A, 12B, conductor patterns are arranged on multiple layers, and the conductor patters are connected via an interlayer connection portion. The substrates 12A, 12B are formed such that multiple base parts are stacked in a hot pressing process. The first multi-layer substrate 12A and the second multi-layer substrate 12B may have the same structure or different structures. Here, the structure represents the number of stacked layers, conductor patterns, the number of semiconductor elements built in the substrates 12A, 12B, the type of semiconductor elements, a height of a whole substrate 12A, 12B or the like. Each multi-layer substrate 12A, 12B is prepared by stacking five base parts 121-125 so that the substrate 12A, 12B has five layers. Since the first multi-layer substrate 12A has the structure similar to the second multi-layer substrate 12B, the structure and the function of the first multi-layer substrate 12A will be explained mainly.

Each base part 121-125 is made of insulation material such as thermo plastic resin. The base parts 121-125 have thicknesses, which are the same or different from each other. Each base part 121-125 may be formed by stacking multiple thinner base portions. One of the base parts 123, which accommodates the semiconductor elements Qa, Qb, may have the thickness substantially equal to the semiconductor elements Qa, Qb. The substantially same thickness means a thickness after the hot pressing process. The substantially same thickness includes a manufacturing tolerance in the hot pressing process. The conductor patterns 12c connecting to the interlayer connection member 12a are arranged on the base parts 121-214 in the hot pressing process so that the conductor patterns 12c and the base parts 121-125 provide multi-layered structure. After the conductor patterns 12c are connected to the interlayer connection member 12a, the interlayer connection member 12a provides a conductor L1-L5 as an interlayer connection part. Similarly, in the second multi-layer substrate 12B, the interlayer connection member 12a provides a conductor L6-L10. The base part 125 corresponds to a common base part, and does not include an interlayer connection member. Thus, the base part 125 is an insulation layer. Alternatively, the structure 10 may not include the base part 125.

Figure 2:
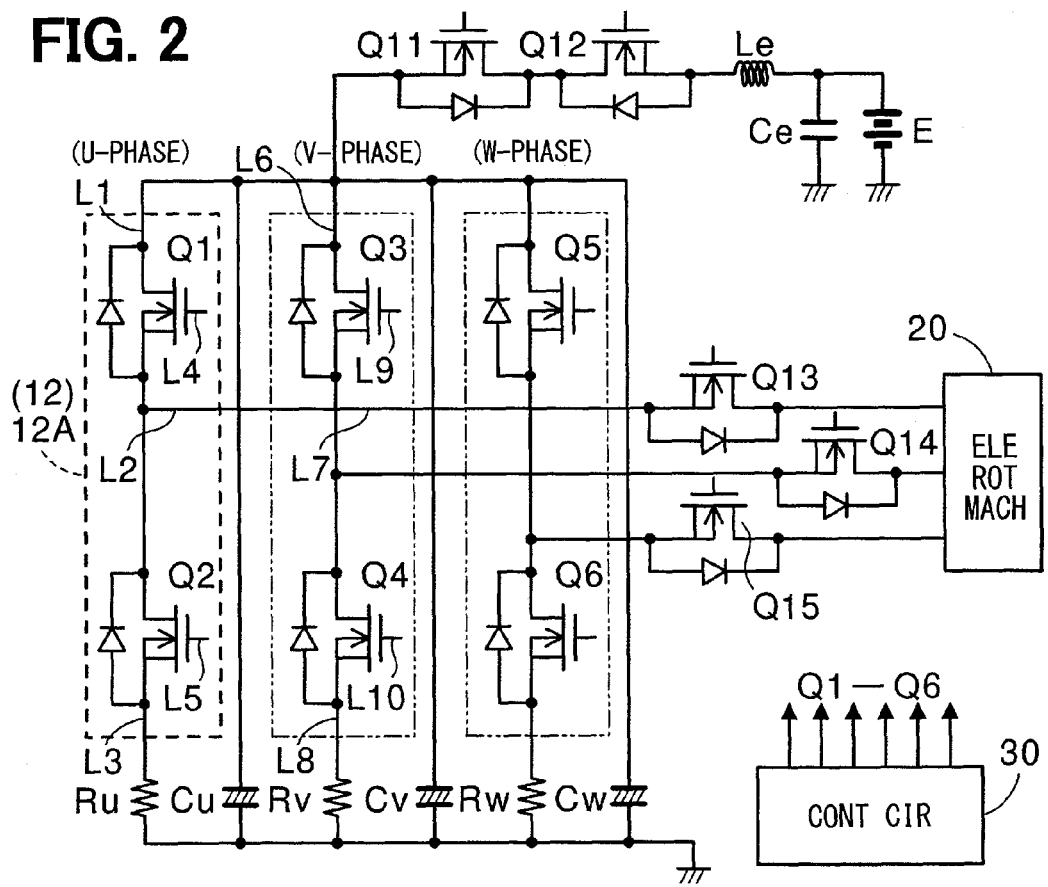
FIG. 2 is a diagram showing a control system for controlling a electric rotating machine.

The multi-layer substrate 12A, 12B shown in FIG. 1 corresponds to one phase of the motor driving circuit. The one phase of the circuit is shown as a region surrounded with a dashed line in FIG. 2. The semiconductor elements Qa, Qb such as a MOS-FET are built in the first multi-layer substrate 12A. The semiconductor elements Qc, Qd such as a MOS-FET are built in the second multi-layer substrate 12B. The semiconductor elements Qa-Qd correspond to electric elements, respectively. The detailed structure of each substrate 12A, 12B will be explained later with reference to FIGS. 3 to 6. In the present embodiment, the semiconductor element Qa in FIG. 1 corresponds to the semiconductor element Q1 in FIG. 2, and the semiconductor element Qb in FIG. 1 corresponds to the semiconductor element Q2 in FIG. 2. Similarly, the semiconductor element Qc in FIG. 1 corresponds to the semiconductor element Q3 in FIG. 2, and the semiconductor element Qd in FIG. 1 corresponds to the semiconductor element Q4 in FIG. 2. In FIG. 2, a diode functioning as a free wheel diode is connected in parallel between an input terminal such as a drain terminal and an output terminal such as a source terminal of each semiconductor element Q1-Q4. The diode may be an actual electric component, which is actually connected to the element Q1-Q4. Alternatively, the diode may be provided by a parasitic diode, which is inherently included in the semiconductor element.

The low heat resistance element 13 is made of material having heat resistance lower than an insulation material of the base parts 121-125 since heat generated at the semiconductor elements Q1-Q4 is transmitted to the heat radiation body 15 via the low heat resistance element 13. The low heat resistance element 13 is arranged to face the semiconductor elements Q1-Q4, which are built in the multi-layer substrates 12A, 12B. In the present embodiment, the low heat resistance element 13 is a metallic plate having a flat shape. The low heat resistance element 13 is disposed between the base part 125 and the heat conducting member 14.

The heat conducting member 14 is disposed between the low heat resistance element 13 and the heat radiation body 15. The heat conducting member 14 fills a small clearance between the low heat resistance element 13 and the heat radiation body 15, and has a low heat resistance. In the present embodiment, the heat conducting member 14 is made of gel having heat conductivity. Alternatively, the heat conducting member 14 may be made of other heat conductive material such as grease, adhesive and sheet. As the clearance becomes small, the heat resistance is low. Thus, the thickness of the heat conducting member 14 may be thin.

Alternatively, the base part 125 and the heat radiation body 15 may be directly bonded to each other without the heat conducting member 14. For example, the base part 125 and the heat radiation body 15 may be bonded by a pressure bonding method. The heat radiation body 15 may be made of any material as long as the heat radiation body 15 radiates heat to the outside of the structure 10. For example, the heat radiation body 15 may be a heat radiation plate or a heat radiation fin. The heat radiation body 15 may be used as a heat conducting member for conducting heat with a cooler or a heater.

A method for manufacturing the heat radiation structure 10 in FIG. 1 will be explained with reference to FIGS. 3 to 8. The method includes a base part forming process, a stacking process, a hot pressing process, a forming process and/or an arranging and heating process. Each process may be performed in no particular order. Further, the method may include one of the forming process and the arranging and heating process. Each process will be explained as follows.

(Base Part Forming Process)

Figure 3:
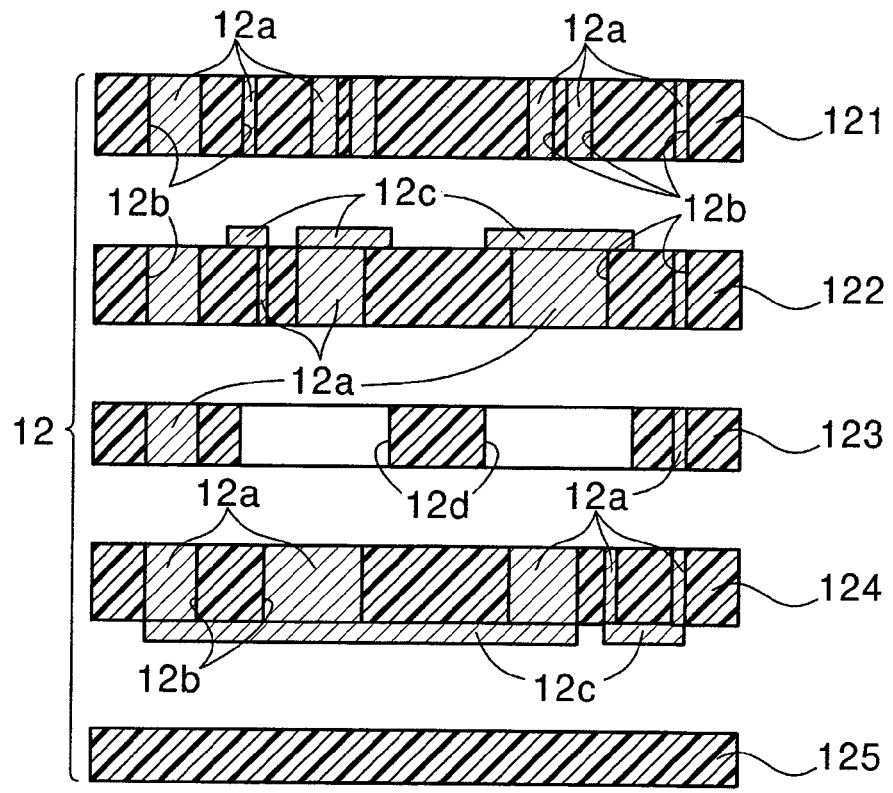
FIG. 3 is a diagram showing an example of a base part forming process.

In the base part forming process, the conductor pattern 12c is formed on one of or both of surfaces of each base part 121-214, as shown in FIG. 3. A via hole 12b, in which the interlayer connection material 12a such as conductive paste is to fill, is formed at a certain position of each base part 121-124.

For example, the via hole 12b is formed in the base part 121, and the via hole 12b is filled with the interlayer connection material 12a. In addition to the interlayer connection material 12a and the via hole 12b, a conductor pattern 12c is formed on the base 122, 124. The conductor pattern 12c formed in the base part 124 may have a large area in order to improve heat radiation performance. In addition to the interlayer connection material 12a and the via hole 12b, an accommodation part 12d is formed in the base part 123. The accommodation part 12d may be a hole or a concavity for accommodating the semiconductor element Qa, Qb. A forming position of the accommodation part 12d in the first multi-layer substrate 12A may be the same as or different from the second multi-layer substrate 12B. The forming position of the conductor pattern 12c in the first multi-layer substrate 12A may be the same as or different from the second multi-layer substrate 12B. The base part 125 may be included in the multi-layer substrate 12A, 12B, or not included in the multi-layer substrate 12A, 12B. The base part 125 is an insulation layer without the inter-layer connection material 12a.

(Stacking Process)

Figure 4:
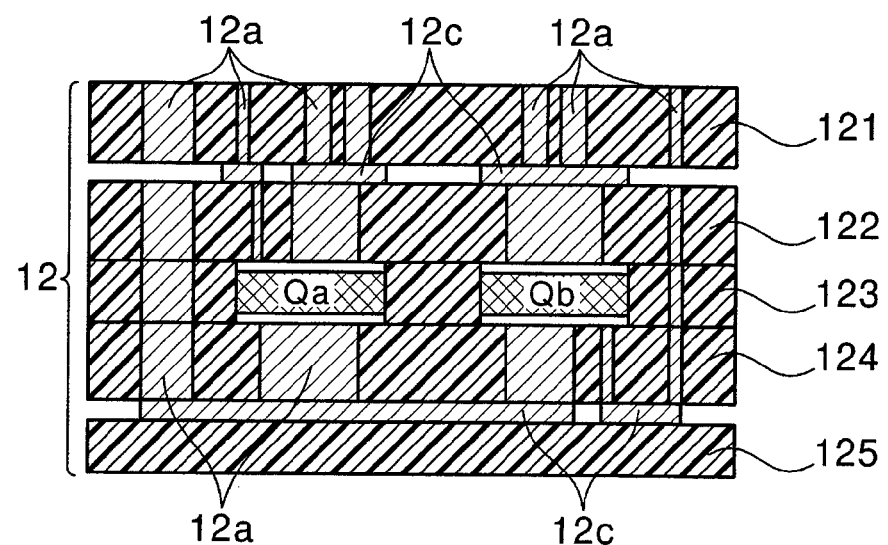
FIG. 4 is a diagram showing an example of a stacking process.

As shown in FIG. 4, the base parts 121-124 formed in the base part forming process and the base part 125 having no inter-layer connection portion are stacked. Before the stacking process or during the stacking process, the semiconductor element Qa, Qb is accommodated in the accommodation part 12d of the base part 123. The base part 125 is arranged between the base part 123 and the heat conducting member 14, as shown in FIG. 1.

(Hot Press Process)

Figure 5:
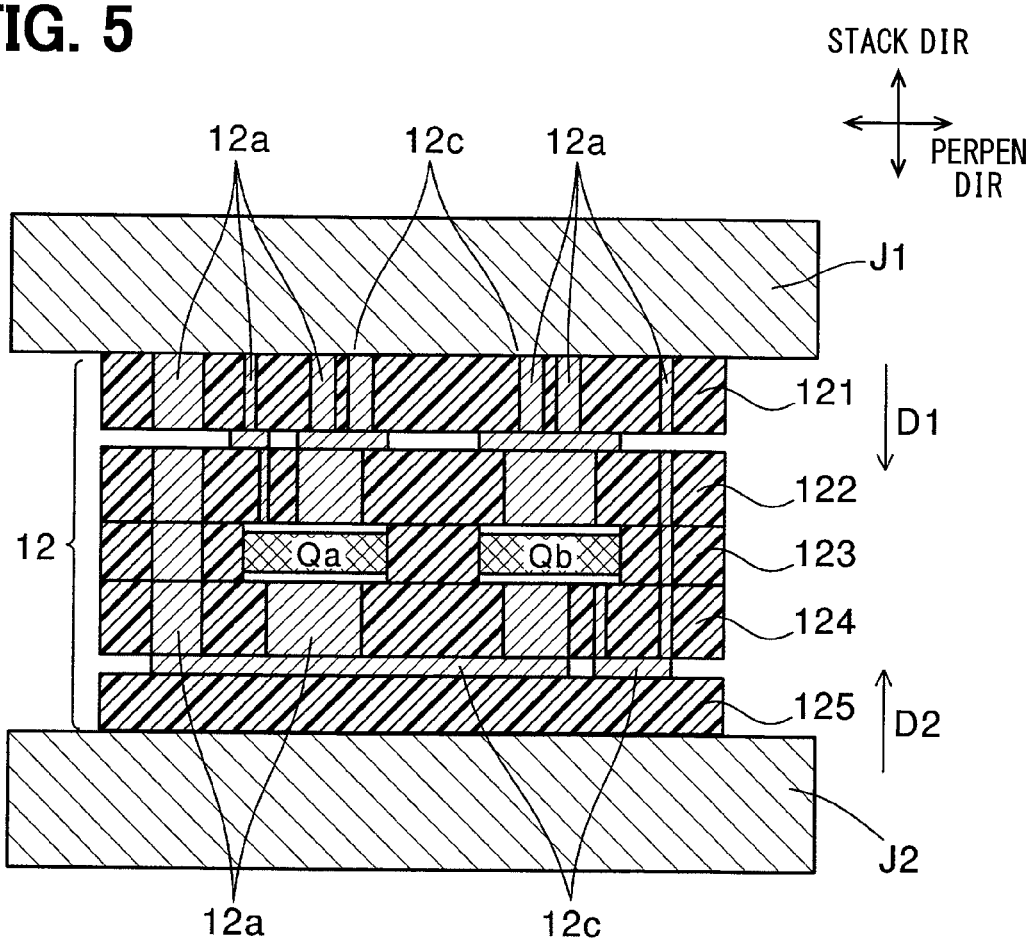
FIG. 5 is a diagram showing an example of a hot pressing process.
Figure 6:
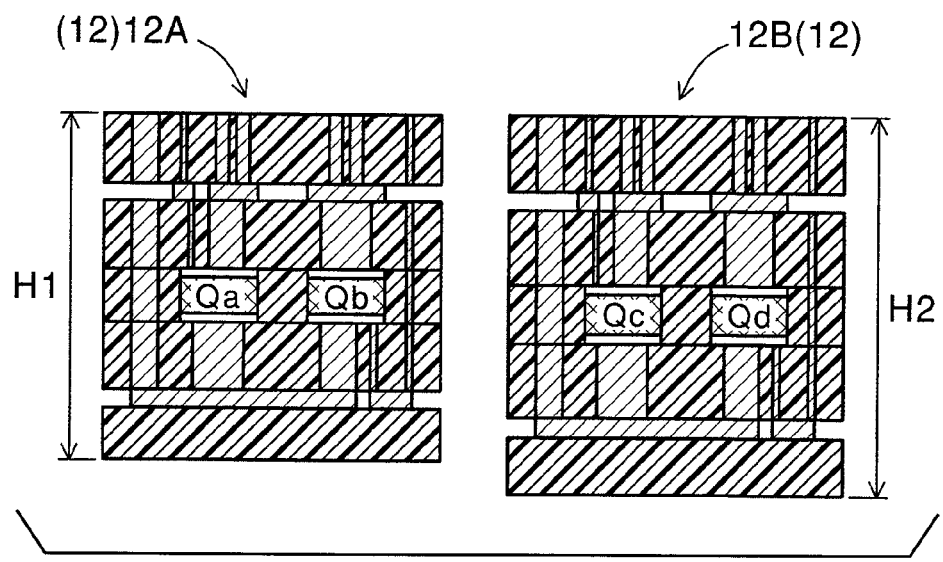
FIG. 6 is a diagram showing an example of height difference of multiple multi-layer substrates.

In the hot press process, the stacked body formed in the stacking process is heated and pressed with a jig J1, J2 as a pressing die as shown in FIG. 5. In FIG. 5, the first jig J1 is displaced to a D1 direction, and the second jig J2 is displaced to a D2 direction. Thus, The jigs J1, J2 are displaced to narrow a distance between the jigs J1, J2. By heating and pressing the stacked body, the base parts 121-125 made of thermo plastic resin are bonded to each other. Further, the inter-layer connection material 12a, the conductor pattern 12c and the semiconductor element Qa, Qb are connected to each other. When the multi-layer substrate 12A, 12B is integrated into one piece, the conductor L1-L10 shown in FIGS. 1 and 2 are also formed. Since the structure of the substrate 12A is different from the substrate 12B, the substrates 12A, 12B after the hot press process shown in FIG. 6 are prepared. In FIG. 6, the height H1 of the first multi-layer substrate 12A is different from the height H2 of the second multi-layer substrate 12B (i.e., H1<H2 in FIG. 6). Alternatively, the height H1 of the first multi-layer substrate 12A may be equal to the height H2 of the second multi-layer substrate 12B within an error range of a manufacturing tolerance (i.e., H1=H2).

(Forming Process)

Figure 7:
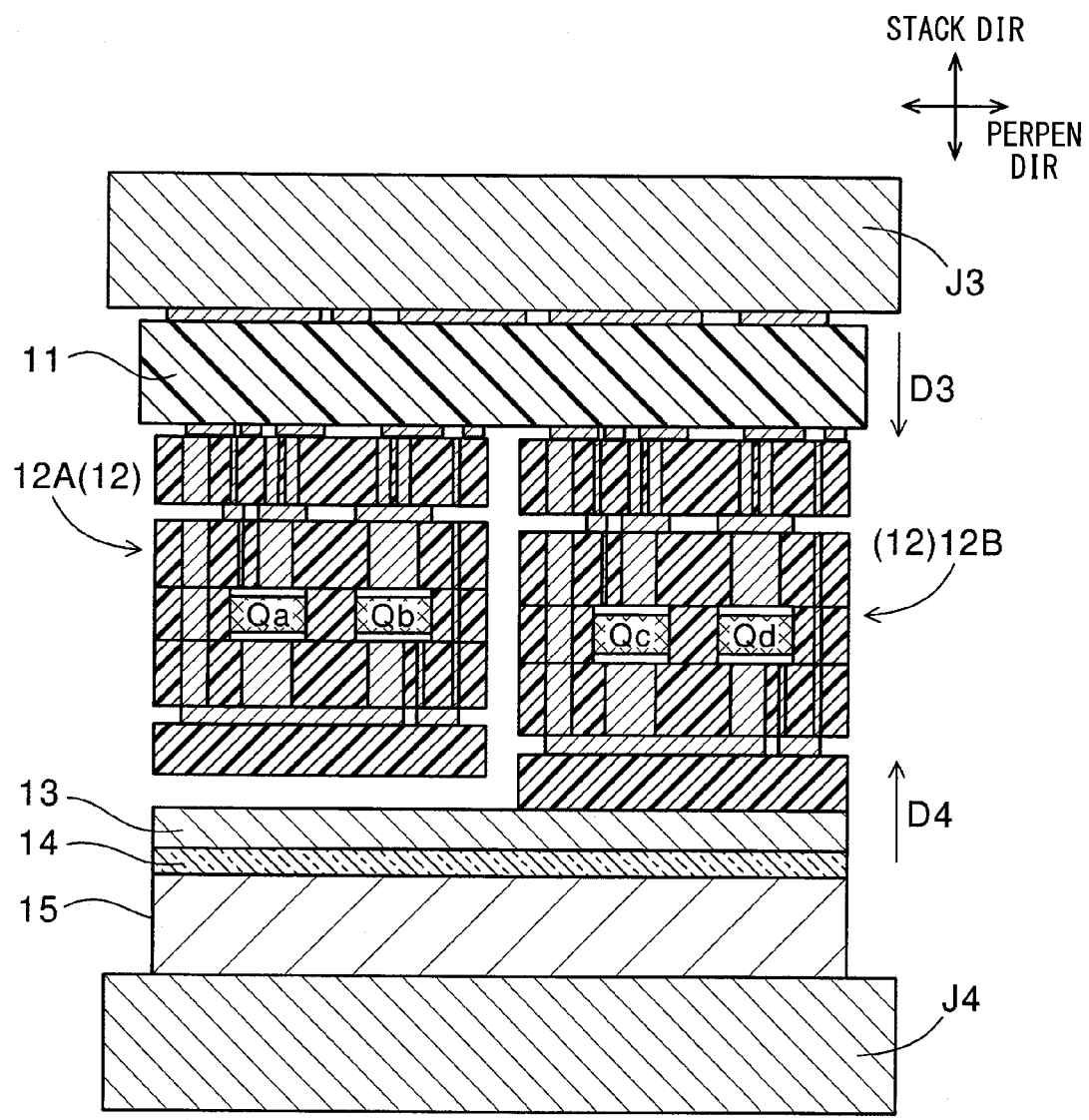
FIG. 7 is a diagram showing an example of a forming process or an arranging and heating process.

In the forming process, the low heat resistance element 13 is bonded with heating and pressing to one surface of the substrate 12A, 12B, which is formed in the hot press process, via the heat conducting member 14. As shown in FIG. 7, the substrates 12A, 12B are arranged along the perpendicular direction, which is not the stacking direction, between the circuit board 11 and the low heat resistance element 13. They are heated and pressed with the jigs J3, J4. In FIG. 7, the first jig J3 is displaced to a D3 direction, and the second jig J4 is displaced to a D4 direction. Thus, the jigs J3, J4 are displaced to relatively narrow a distance between the jigs J3, J4. The jigs J3, 34 may be equal to the jigs J1, J2 or the jigs J3, J4 may be different from the jigs J1, J2. The D3 direction and the D4 direction may be equal to the D1 direction and the D2 direction, or the D3 direction and the D4 direction may be different from the D1 direction and the D2 direction. A circuit pattern (i.e., a wiring pattern) on the circuit board 11, the conductor L1-L10 and the conductor pattern 12c in the multi-layer substrates 12A, 12B are connected to each other in the heating and pressing process. The thickness of the heat conducting member 14 may be thin in order to reduce a heat resistance.

Figure 8:
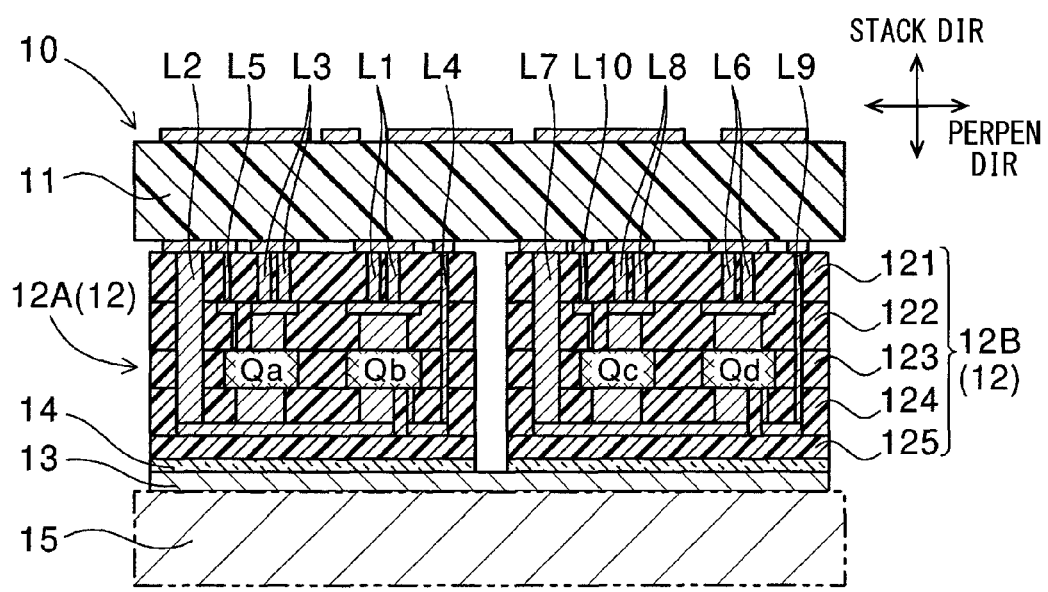
FIG. 8 is a diagram showing a cross sectional view of the second heat radiation structure of the electric element.

When the forming process is executed, the heat radiation structure 10 in FIG. 1 is manufactured. When the forming process is executed, the heights H1, H2 of the substrates 12A, 12B become equal to each other. The same height includes an error range of a manufacturing tolerance. Specifically, the same height includes an error range, which is adjustable by the thickness of the heat conducting member 14. When the low heat resistance element 13 and the heat conducting member 14 are reversely arranged, the heat radiation structure shown in FIG. 8 is manufactured. The heat radiation structure 10 may include the heat radiation body 15 shown as a chain double dashed line in FIG. 8. Alternatively, the structure 10 may not include the heat radiation body 15.

(Arranging and Heating Process)

In the arranging and heating process, the low heat resistance element 13 is directly arranged on one common surface of the multi-layer substrates 12A, 12B, which is formed in the hot press process, without the heat conducting member 14. Then, the element 13 on the substrates 12A, 12B is heated. Specifically, as shown in FIG. 7, after the substrates 12A, 12B are arranged on the circuit board 11 along the perpendicular direction, which is perpendicular to the stacking direction, the low heat resistance element 13 is arranged on the substrates 12A, 12B. If necessary, the element 13 on the substrates 12A, 12B is pressed with the jigs J3, J4 in addition to the heating.

Figure 9:
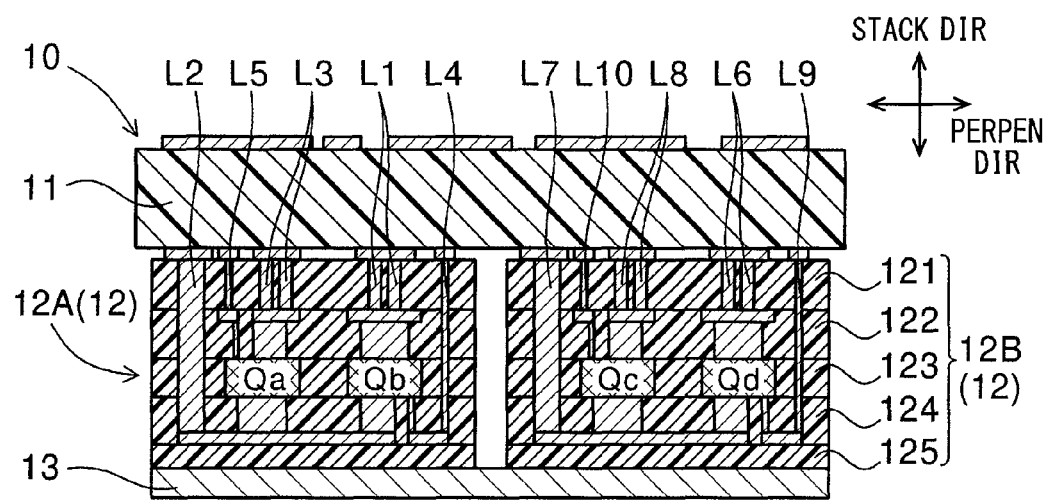
FIG. 9 is a diagram showing a cross sectional view of the heat radiation structure of the electric element.

After the arranging and heating process is performed, the heat radiation structure 10 shown in FIG. 9 is manufactured. When the arranging and heating process is performed, the heights H1, H2 of the substrates 12A, 12B become equal to each other. In FIG. 9, the multi-layer substrates 12A, 12B (specifically, the base part 125) and the low heat resistance element 13 are directly bonded to each other. Alternatively, the heat radiation structure 10 may include the heat conducting member 14 between the multi-layer substrates 12A, 12B and the low heat resistance element 13.

In the above embodiment, the following effects are obtained.

The heat radiation structure 10 includes the low heat resistance element 13 having the heat resistance lower than the insulation material, and the low heat resistance element 13 is arranged to face multiple semiconductor elements Qa-Qd built in the multi-layer substrates 12A, 12B. In this case, the low heat resistance element 13 is arranged to face the semiconductor elements Qa-Qd regardless of the built-in condition of the semiconductor elements Qa-Qd in the substrates 12A, 12B. Even if the height H1 of the substrate 12A is different from the height H2 of the substrate 12B, the heights H1, H2 can be equalized in the heating and pressing process. Thus, a clearance in the structure 10 is easily controlled. Further, since the low heat resistance element 13 has the low heat resistance, heat generated at the semiconductor elements Qa-Qd is transmitted and radiated to the outside of the structure 10. Thus, the heat radiation performance for the semiconductor elements Qa-Qd is improved. In the present embodiment, the structure 10 includes two multi-layer substrates 12A, 12B. Alternatively, the structure 10 may include three multi-layer substrates 12.

The system 10 includes the heat conducting member 14 arranged between the low heat resistance element 13 and the heat radiation body 15 as shown in FIG. 1. Alternatively, the system 10 includes the heat conducting member 14 arranged between the low heat resistance element 13 and the substrates 12A, 12B as shown in FIG. 8. In each case, heat generated at the semiconductor elements Qa-Qd is transmitted to the heat radiation body 15 and the low heat resistance element 13 via the heat conducting member 14. Thus, the heat radiation efficiency is improved.

The base parts 121-124 adjacent to the base part 125 as the insulation layer includes the conductor pattern 12c on a surface of the part 121-124, which faces the low heat resistance element 13, as shown in FIG. 1. In this case, the heat generated at the semiconductor elements Qa-Qd is transmitted to the heat radiation body 15 from the conductor pattern 12c in the base part 124 via the base part 125 and the heat conducting member 14. Accordingly, the heat radiation efficiency is much improved. Further, when the area of the conductor pattern 12c of the base part 124 is large, the heat radiation efficiency becomes much improved.

Multiple multi-layer substrates 12A, 12B are arranged along the perpendicular direction (i.e., not-stacking direction) on a surface of the circuit board 11, which is opposite to the low heat resistance element 13. The heat generated at the semiconductor elements Qa-Qd built in the substrates 12A, 12B is radiated via the low heat resistance element 13, as shown in FIGS. 1, 8 and 9. In this case, the low heat resistance element 13 has the heat resistance lower than the insulation material of the base parts 121-125. Thus, the heat at the semiconductor elements Qa-Qd is transmitted via the low heat resistance element 13. Accordingly, the heat radiation performance of the semiconductor elements Qa-Qd is increased.

The semiconductor elements Qa-Qd are accommodated in the accommodation portion 12d in one of the base parts 121-125, as shown in FIGS. 1, 8 and 9. In this case, the hot press process does not affect the semiconductor elements Qa-Qd. Even if the accommodation portion 12d is formed across multiple base parts 121-125 so that the semiconductor elements Qa-Qd are accommodated in the accommodation portion 12d, the similar effects are obtained. Further, even if the electric elements such as a resistor, a capacitor and a coil, which generate heat when the elements are energized, are accommodated in the accommodation portion 12d in addition to the semiconductor elements Qa-Qd, the similar effects are obtained.

The semiconductor elements Qa-Qd and the base part 123, in which the semiconductor elements Qa-Qd are accommodated, have substantially the same thickness, as shown in FIGS. 1, 8 and 9. In this case, the accommodation portion 12d is formed only in the base part 123. Thus, the forming cost of the accommodation portion 12d is limited.

The manufacturing method of the heat radiation structure 10 includes: a base part forming process for forming the conductor pattern 12c on both of or one of surfaces of each base part 121-125, which is made of insulation material and for forming the via hole 12b, in which the inter-layer connection material 12a is embedded, at a certain position of each base part 221-125, as shown in FIG. 3; a stacking process for accommodating one or more semiconductor elements Qa-Qd in the accommodation portion 12d of the base part 123 and for stacking multiple base parts 121-125, as shown in FIG. 4; the hot press process for heating and pressing the stacked body formed in the stacking process with using the jigs J3, J4 as the press die so that the base parts 121-125 are bonded to each other and the multi-layer substrates 12A, 12B are formed, as shown in FIG. 5; and an arranging and heating process for arranging the low heat resistance element 13 directly, without the heat conducting member, on one surface of one of more multi-layer substrates 12A, 12B formed in the hot press process. The arranging and heating process may be replaced with the forming process for heating and press-bonding the low heat resistance element 13 via the heat conducting member 14, as shown in FIG. 7. In each case, at least the low heat resistance element 13 is arranged to face the semiconductor elements Qa-Qd built in the substrates 12A, 12B. Even if the height H1, H2 of the semiconductor elements Qa-Qd and the height of the substrates 12A, 12B are different from each other, the height is equalized in the heating process or the heating and pressing process. Thus, the clearance in the structure 10 is easily controlled. Further, since the heat resistance of the low heat resistance element 13 is low, the heat generated at the semiconductor elements Qa-Qd is transmitted. Thus, the heat radiation performance of the semiconductor element Qa-Qd is improved.

In the hot press process, multiple multi-layer substrates 12A, 12B are arranged on the circuit board 11 along the not-stacking direction. Then, the substrates 12A, 12B are heated and pressed with the jigs J3, J4, as shown in FIG. 7. In this case, the circuit board 11 and multiple substrates 12A, 12B are surely bonded to each other. Since the height of each substrate 12A, 12B is equalized in the hot press process, the clearance (i.e., the gap) in the structure 10 is easily controlled.

In the forming process, one or more multi-layer substrates 12A, 12B and/or one or more semiconductor elements Qa-Qd are arranged along the not-stacking direction between the circuit board 11 and the low heat resistance element 13. Then, the substrates 12A, 12B and the elements Qa-Qd with the circuit board 11 and the element 13 are heated and pressed with the jigs J3, 34, as shown in FIG. 7. In this case, the circuit board 11, the substrates 12A, 12B and the semiconductor elements Qa-Qd are surely bonded to each other.

In the arranging and heating process, the multi-layer substrates 12A, 12B are arranged on the circuit board 11. Then, the low heat resistance element 13 is arranged, as shown in FIG. 7. In this case, the circuit board 11 and the substrates 12A, 12B are surely bonded to each other.

Second Embodiment

In a second embodiment, the heat radiation structure has the multi-layer substrate and the electric element between the circuit board and the heat radiation body. The structure will be explained with reference to FIGS. 10 to 13.

Figure 10:
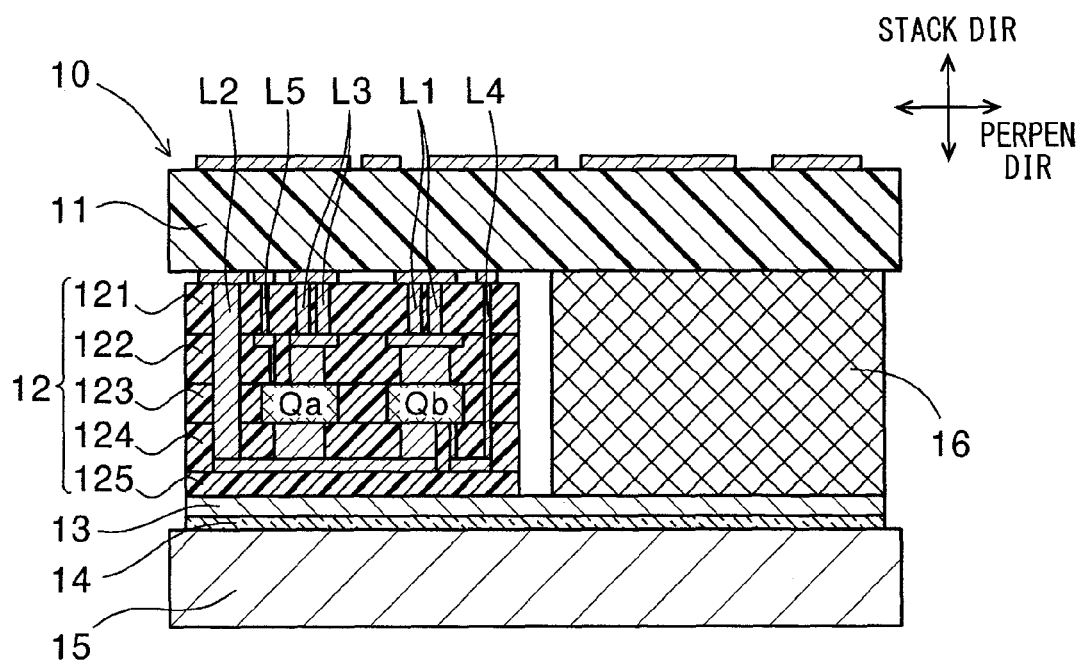
FIG. 10 is a diagram showing a cross sectional view of a heat radiation structure of an electric element according to a second embodiment.

The heat radiation structure 10 shown in FIG. 10 includes the circuit board 11, the multi-layer substrate 12, the low heat resistance element 13, the heat conducting member 14, the heat radiation body 15 and the electric element 16. In the present embodiment, the structure 10 includes one multi-layer substrate 12 and one electric element 16.

The multi-layer substrate 12 corresponds to the substrate 12A, 12B in the first embodiment. Alternatively, the substrate 12 according to the second embodiment corresponds to a multi-layer substrate according to other embodiments. The electric element 16 may be a semiconductor device such as a switching element, a diode, a semiconductor relay and an IC, which is not built in the substrate 12, and/or a resistor, a capacitor, a coil, a reactor or the like.

Next, a manufacturing method of the heat radiation structure 10 in FIG. 10 will be explained with reference to FIGS. 11 and 12. The manufacturing method includes a base part forming process, a stacking process, a hot press process, a forming process, and/or an arranging and heating process, similar to the first embodiment. The forming process or an arranging and heating process according to the second embodiment is different from the first embodiment.

Figure 11:
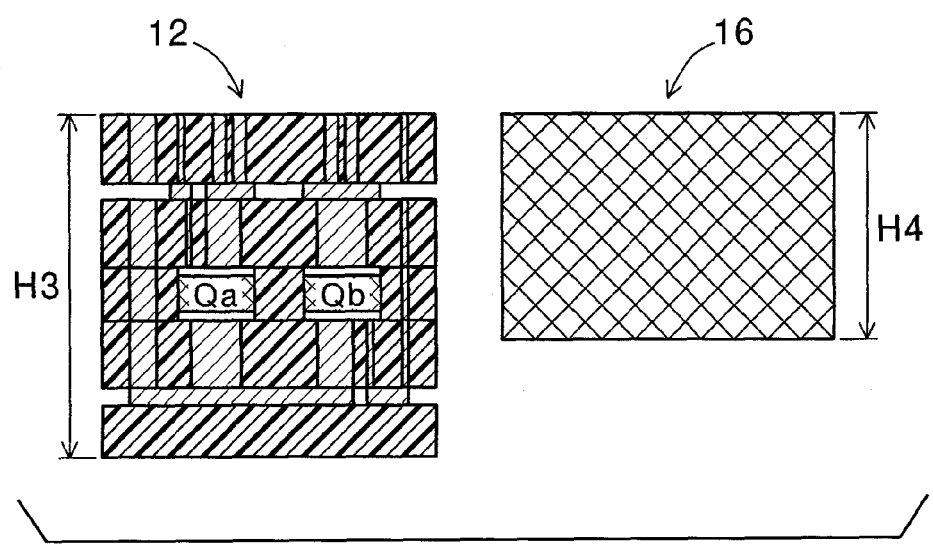
FIG. 11 is a diagram showing an example of a height difference of an electric element and a multi-layer substrate.
Figure 12:
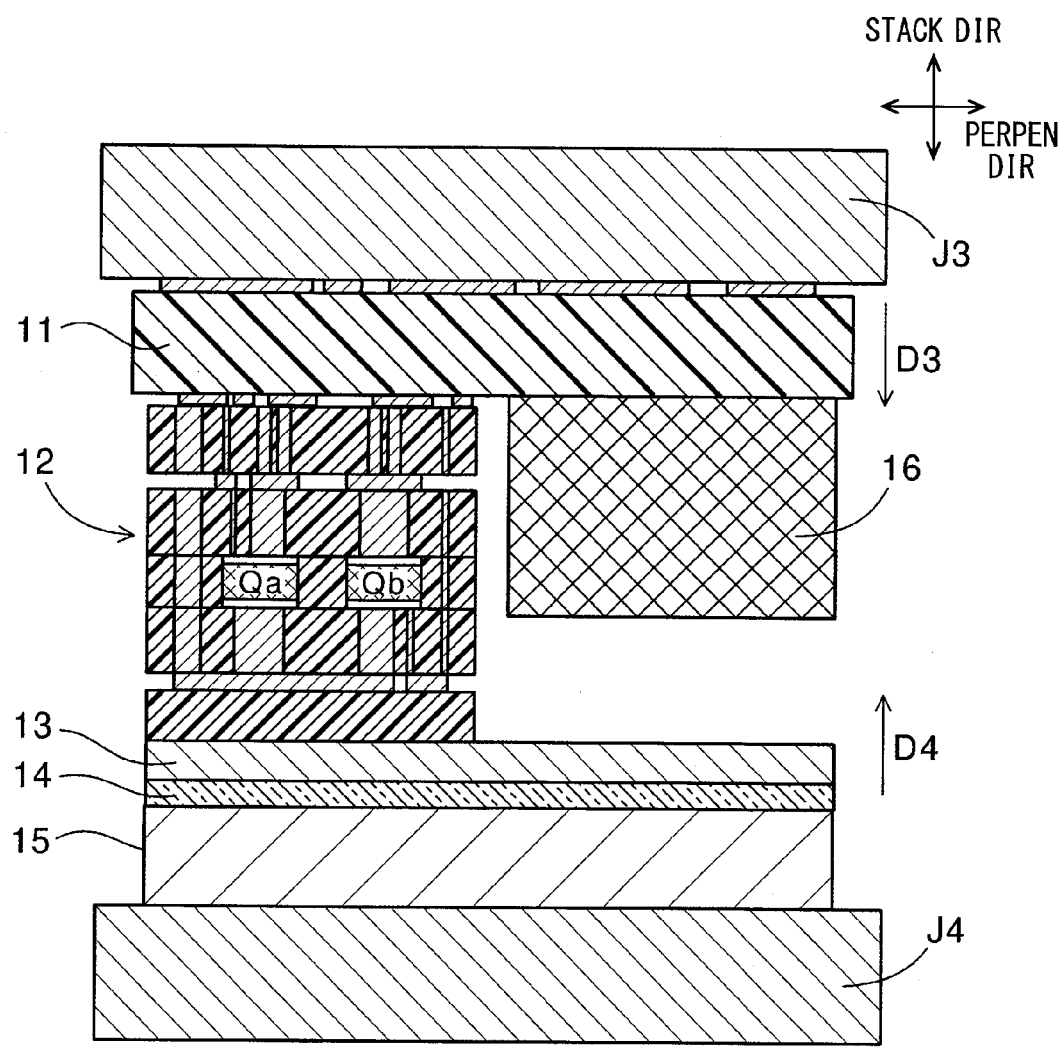
FIG. 12 is a diagram showing an example of a forming process or an arranging and heating process.

After the base part forming process, the stacking process, and the hot press process are executed, the multi-layer substrate 12 shown in FIG. 11 is formed. In FIG. 11, the height H3 of the multi-layer substrate 12 is different from the height H4 of the electric element 16 (i.e., H3>H4). Alternatively, the height H3 of the multi-layer substrate 12 may be equal to the height H4 of the electric element 16 (i.e., H3=H4) within the error range of the manufacturing tolerance.

(Forming Process)

In the forming process, the low heat resistance element 13 is heated and press-bonded to one common surface of the substrate 12 and the electric element 16 via the heat conducting member 14. As shown in FIG. 12, the multi-layer substrate 12 and the electric element 16 are arranged along the not-stacking direction between the circuit board 11 and the low heat resistance element 13. Then, the jigs J3, 34 are relatively displaced, so that the substrate 12 and the electric element 16 with the board 11 and the low heat resistance element 13 are heated and pressed. The circuit pattern (i.e., wiring pattern) on the circuit board 11 is connected to the conductor L1-L5 of the substrate 12, the conductor pattern 12c and the electric element 16 in the heating and pressing process.

Figure 13:
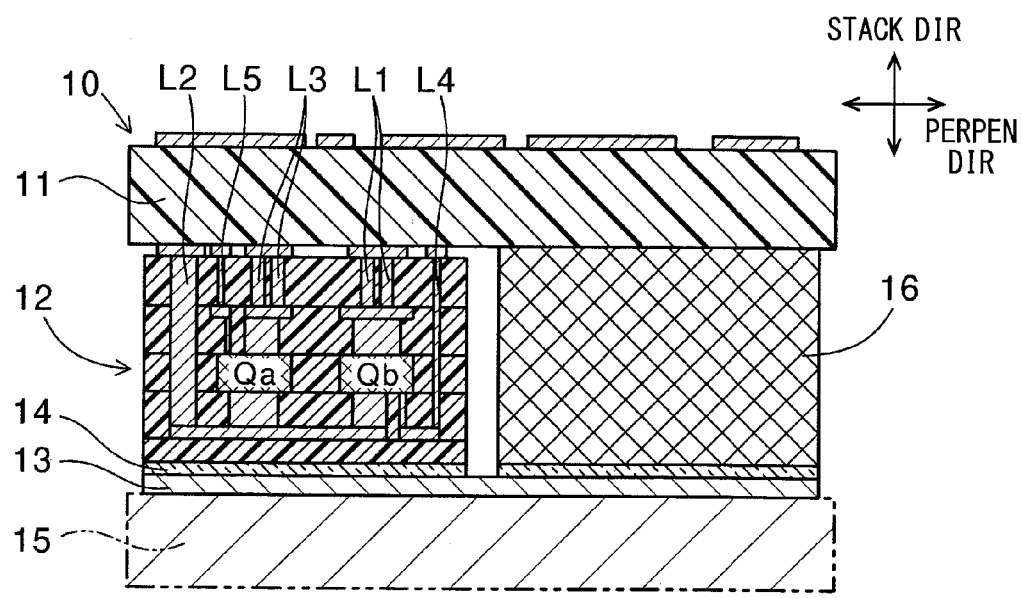
FIG. 13 is a diagram showing a cross sectional view of the heat radiation structure of the electric element.

When the above forming process is performed, the heat radiation structure 10 shown in FIG. 10 is manufactured. When the forming process is executed, the height H3 of the substrate 12 and the height H4 of the electric element 16 are equalized. The low heat resistance element 13 and the heat conducting member 14 may be reversely arranged. In this case, when the forming process is executed, the heat radiation structure 10 shown in FIG. 13 is manufactured. Alternatively, the structure 10 may include the heat radiation body 15 shown as a chain double dashed line in FIG. 13. Alternatively, the structure 10 may not include the heat radiation body 15.

(Arranging and Heating Process)

In the arranging and heating process, the low heat resistance element 13 is directly arranged on one common surface of the multi-layer substrate 12 and the electric element 16, which are formed in the hot press process, without the heat conducting member 14. Then, low heat resistance element 13 with the substrates 12A, 12B is heated. As shown in FIG. 12, the multi-layer substrate 12 and the electric element 16 are arranged along the not-stacking direction on the circuit board 11, and then, the low heat resistance element 13 is arranged. Then, the board 11 with the substrate 12, the electric element 16 and the low heat resistance element 13 are heated. If necessary, the jigs J3, J4 may be used to press in addition to the heating.

When the arranging and heating process is performed, the heat radiation structure 10 shown in FIG. 10 other than the heat conducting member 14 and the heat radiation body 15 is formed. When the arranging and heating process is executed, the height H3 of the substrate 12 and the height H4 of the electric element 16 are equalized. In FIG. 10, the multi-layer substrate 12 (specifically, the base part 125) and the low heat resistance element 13 are directly bonded to each other. Alternatively, the structure 10 may include the heat conducting member 14 between the substrate 12 and the low heat resistance element 13.

In the second embodiment, the multi-layer substrate 12A according to the first embodiment is replaced with the substrate 12. Further, the multi-layer substrate 12B according to the first embodiment is replaced to the electric element 16. Thus, the similar effects of the first embodiment are obtained.

Third Embodiment

In a third embodiment, the heat radiation structure includes multiple electric elements between the circuit board and the heat radiation body. The structure will be explained with reference to FIGS. 14 to 16.

Figure 14:
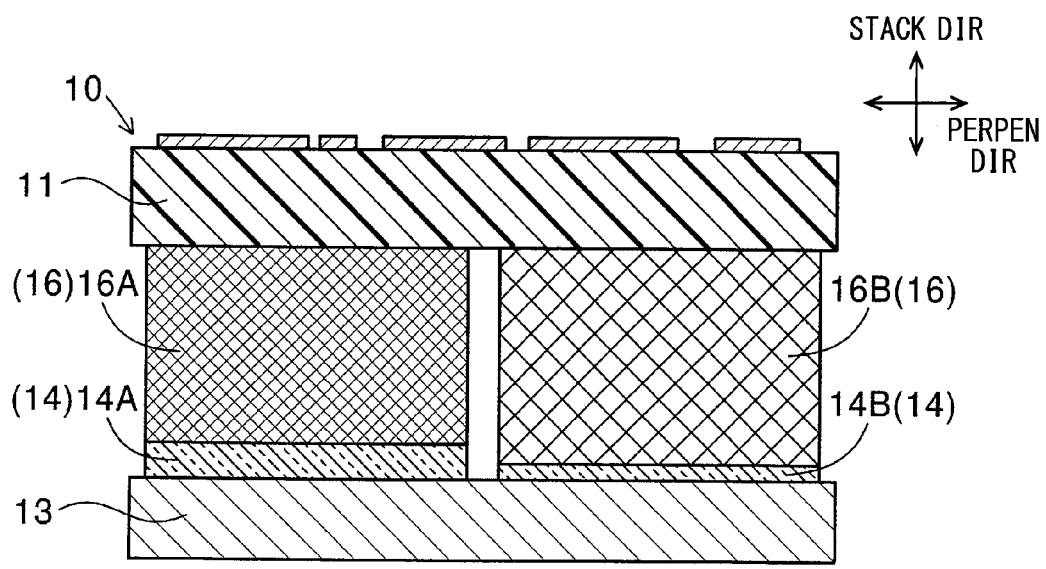
FIG. 14 is a diagram showing a cross sectional view of a heat radiation structure of an electric element according to a third embodiment.

The heat radiation structure 10 shown in FIG. 14 includes the circuit board 11, the low heat resistance element 13, the heat conducting member 14, the heat radiation body 15, and multiple electric elements 16. In the present embodiment, multiple electric elements 16 include a first electric element 16A and a second electric element 16B.

The electric element 16A, 16B corresponds to the electric element 16 according to the second embodiment and/or other electric devices. The electric element 16A, 16B may be a semiconductor device such as a switching element, a diode, a semiconductor relay and an IC, and/or a resistor, a capacitor, a coil, a reactor or the like. The electric element 16A may be the same kind of a device as the electric element 16B. Alternatively, the electric element 16A may be the different kind of a device from the electric element 16B.

Next, a manufacturing method of the heat radiation structure 10 will be explained with reference to FIGS. 15 and 16. The manufacturing method includes a base part forming process, a stacking process, a hot press process, an arranging and heating process, and the like. The manufacturing method does not include the forming process, which is different from the first embodiment.

Figure 15:
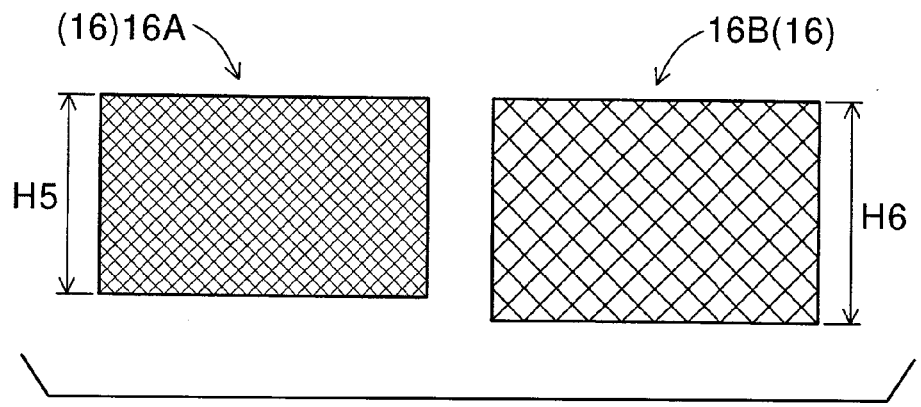
FIG. 15 is a diagram showing an example of a height difference of multiple electric elements.

In FIG. 15, the height H5 of the first electric element 16A is different from the height H6 of the second electric element 16B (i.e., H5<H6 in FIG. 15). Alternatively, the height H5 of the first electric element 16A may be equal to the height H6 of the second electric element 16B within an error range of a manufacturing tolerance (i.e., H5=H6).

(Arranging and Heating Process)

In the arranging and heating process, the low heat resistance element 13 is arranged on one common surface of each electric element 16A, 16B via the heat conducting member 14A, 14B, respectively. Then, the low heat resistance element 13 with the electric elements 16A, 16B and the heat conducting members 14A, 14B, are heated and bonded to each other. Specifically, as shown in FIG. 16, the electric elements 16A, 16B are arranged on the circuit board 11 along the not-stacking direction, and then, the low heat resistance element 13 is arranged. Then, the electric elements 16A, 16B with the circuit board 11 and the low heat resistance element 13 are heated. In addition to the heating, the jigs J3, J4 are displaced so as to bond each other. The bonding method may include a press-bonding method. The displacement manner of the jigs J3, 34 is similar to the first embodiment. When the heating process and the displacement of the jigs J3, 34 are performed, the circuit pattern (i.e., the wiring pattern) on the circuit board 11 and the electric elements 16A, 16B are connected to each other. After bonding the electric elements 16A, 16B with the circuit board 11 and the low heat resistance element 13, the thickness of the heat conducting member 14A is different from the heat conducting member 14B. The thickness of each heat conducting member 14A, 14B may be thin in order to reduce the heat resistance.

When the arranging and heating process is performed, the heat radiation structure 10 shown in FIG. 14 is manufactured. When the arranging and heating process is performed, a total of the height H5 of the first electric element 16A and the thickness of the first heat conducting member 14A is substantially equal to a total of the height H6 of the second electric element 16A and the thickness of the second heat conducting member 14B. The low heat resistance element 13 in FIG. 14 may be replaced with the heat radiation body 15 in FIGS. 1 and 10. As shown in FIGS. 8 and 13, the structure 10 may include the heat radiation body integrated with the low heat resistance element 13.

In the third embodiment, the multi-layer substrate 12A according to the first embodiment is replaced with the electric element 16A, and the multi-layer substrate 12B according to the first embodiment is replaced with the electric element 16B. Accordingly, the similar effects to the first embodiment are obtained. Further, the following effects are also obtained.

Figure 16:
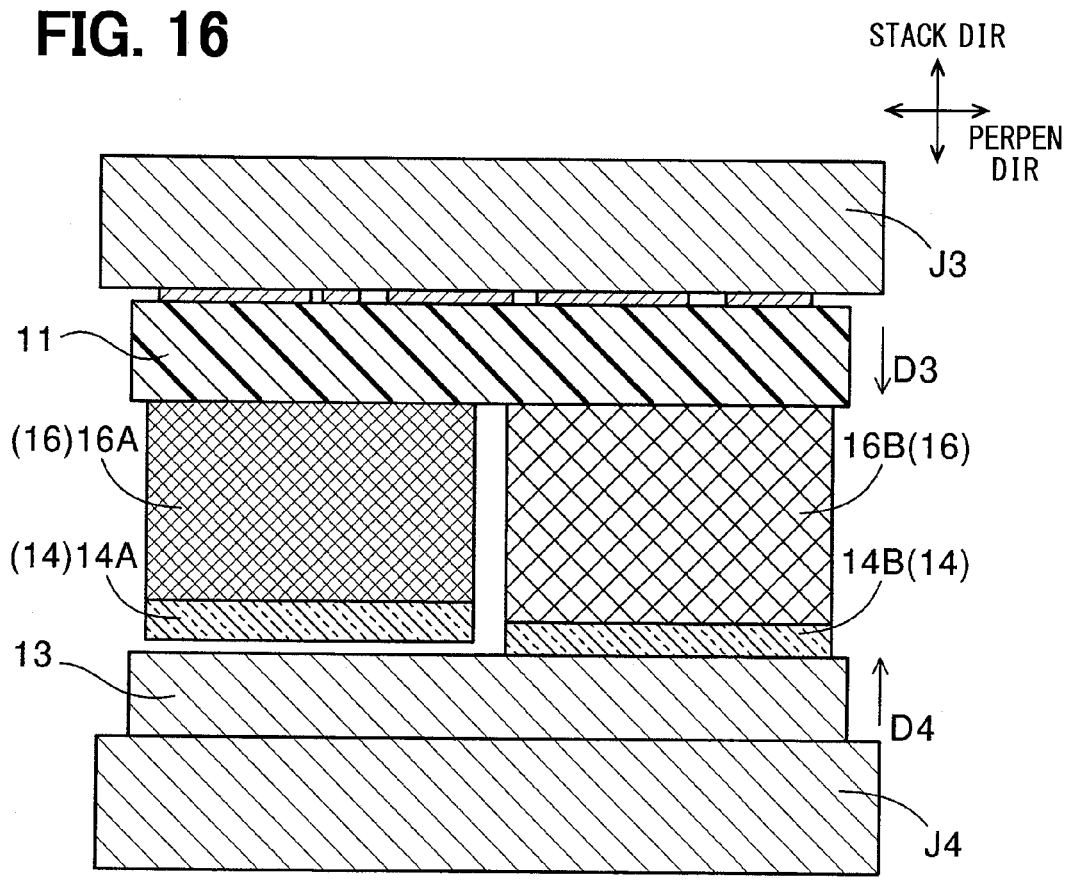
FIG. 16 is a diagram showing an example of an arranging and heating process.

The manufacturing method of the heat radiation structure 10 includes: the electric element arranging process for arranging multiple electric elements 16A, 16B on the circuit board 11 along the not-stacking direction; and the arranging and heating process for arranging the low heat resistance element 13 on a surface of multiple electric elements 16A, 16B, which is opposite to the circuit board 11, via the heat conducting member 14 and for heating and bonding the low heat resistance element 13 with the multiple electric elements 16A, 16B via the heat conducting member 14, as shown in FIG. 16. In this case, even if the heights H5, H6 of the electric elements 16A, 16B arranged along the not-stacking direction are different from each other, the totals of the heights of the electric elements 16A, 16B and the thicknesses of the heat conducting members 14A, 14B are substantially equalized. Thus, the clearance in the structure 10 is easily controlled. Further, since the low heat resistance element 13 has the low heat resistance, heat generated at the electric elements 16A, 16B is transmitted, i.e., conducted. Thus, the heat radiation performance of the electric elements 16A, 16B is improved.

Other Embodiments

Figure 17:
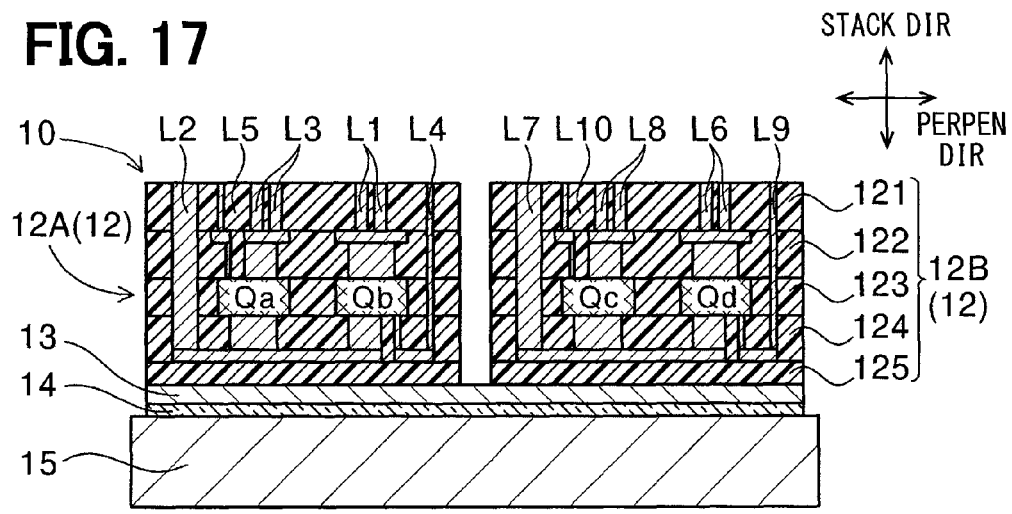
FIG. 17 is a diagram showing a cross sectional view of a heat radiation structure of an electric element according to other embodiments.
Figure 18:
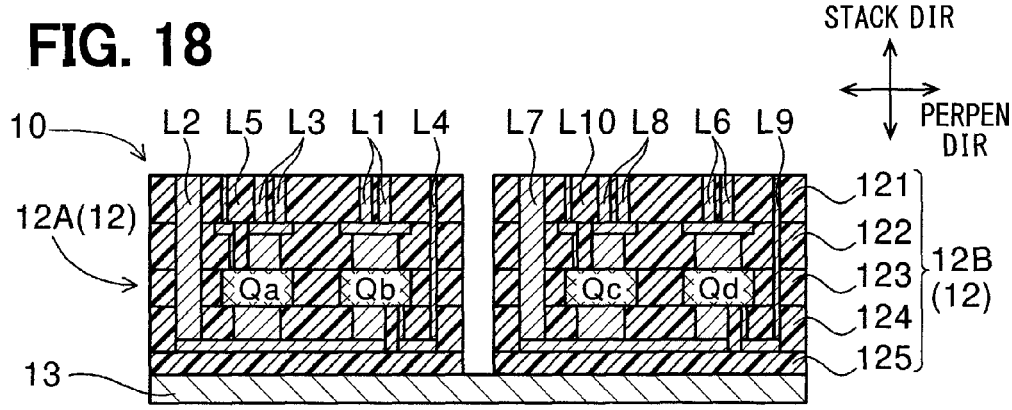
FIG. 18 is a diagram showing a cross sectional view of a heat radiation structure of an electric element according to the other embodiments.
Figure 19:
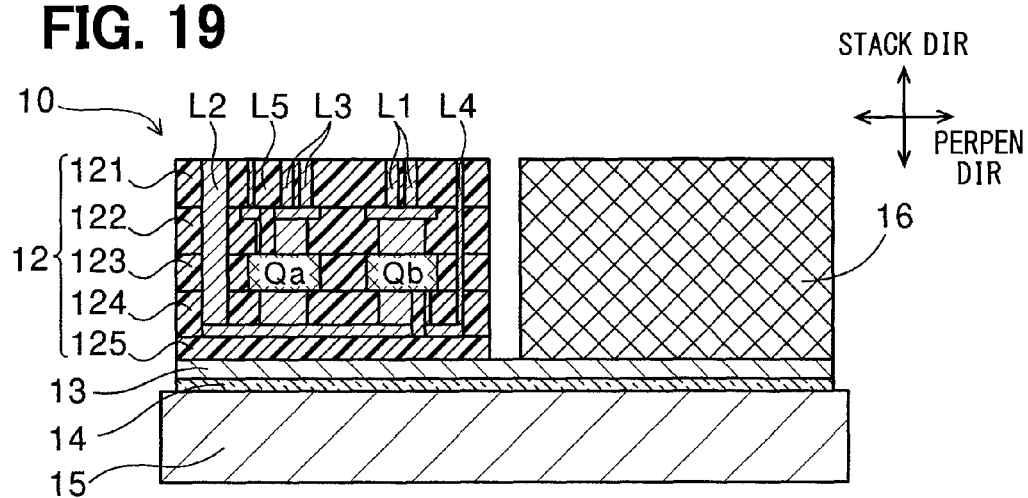
FIG. 19 is a diagram showing a cross sectional view of a heat radiation structure of an electric element according to the other embodiments.

In the first and second embodiments, the heat radiation structure 10 includes the circuit board 11. Alternatively, the heat radiation structure 10 may not include the circuit board 11, as shown in FIGS. 17 to 19. The heat radiation structure 10 in FIG. 17 corresponds to the structure 10 in FIG. 1. The heat radiation structure 10 in FIG. 18 corresponds to the structure 10 in FIG. 9. The heat radiation structure 10 in FIG. 19 corresponds to the structure 10 in FIG. 10. In these cases, since the circuit board 11 is not arranged in each process in FIGS. 7 and 12, the heating and pressing process is performed with using the jigs J3, J4. Since the difference between these cases and the first and second embodiments is merely a feature that the structure 10 does not include the circuit board 10, the similar effects to the first and second embodiments are obtained.

In the first and second embodiments, the multi-layer substrate 12, 12A, 12b includes five layers of the base parts 121-125. Alternatively, the multi-layer substrate 12, 12A, 12b may include more than five layers or less than five layers of the base parts according to the required circuit construction. For example, the multi-layer substrate 12, 12A, 12b may include a few tens layers such as fifty layers. Since the difference between this case and the first and second embodiments is the number of stacked layers, the similar effects to the first and second embodiments are obtained.

In the first and second embodiments, the semiconductor elements Qa-Qd such as the switching element corresponding to the electric element are built in the multi-layer substrate 12, 12A, 12B. Alternatively, an electric device other than the semiconductor elements Qa-Qd may be built in the multi-layer substrate 12, 12A, 12B according to the required circuit construction. Further, the number of electric devices built in the multi-layer substrate 12, 12A, 12B may be set appropriately. The electric device may be a semiconductor element such as a diode, a semiconductor relay and an IC, and/or a resistor, a capacitor, a coil, a reactor or the like in addition to the switching element. Since the difference between this case and the first and second embodiments is merely the electric element built in the multi-layer substrate 12, 12A, 12B, the similar effects to the first and second embodiments are obtained.

In the first and second embodiments, the heat radiation body 15 is arranged on the one common surface of the multi-layer substrates 12A, 12B via the heat conducting member 14, or the heat radiation body 15 is directly arranged on the one common surface of the multi-layer substrates 12A, 12B without the heat conducting member 14. Alternatively, the structure 10 may include a cooler other than the heat radiation body 15 such as a device having a pipe, in which liquid coolant such as water and oil flows so as to cool. Alternatively, the structure 10 may include a heater or a temperature controller such as the cooler and the heater with a controller. When the structure 10 includes the cooler, the semiconductor elements Qa-Qd built in the multi-layer substrate 12, 12A, 12B is directly cooled by the cooler. When the structure 10 includes the heater, the semiconductor elements Qa-Qd built in the multi-layer substrate 12, 12A, 12B is directly heated by the cooler. In each case, the semiconductor elements Qa-Qd corresponding to the electric element 16 and the electric device other than the electric element 16 functions at appropriate temperature.

In the first to third embodiments, the multi-layer substrate 12, 12A, 12B and the electric element 16, 16A, 16B provide a part of the control circuit for controlling the three-phase electric rotating machine 20. Alternatively, the multi-layer substrate 12, 12A, 12B and the electric element 16, 16A, 16B may provide a part of the control circuit for controlling the electric rotating machine 20 having more than three phases or less than three phases such as a single phase electric rotating machine and a six phase electric rotating machine. Alternatively, the multi-layer substrate 12, 12A, 12B and the electric element 16, 16A, 16B may provide a part of the control circuit for controlling a load other than the electric rotating machine 20. Since the difference between this case and the first to third embodiments is merely a control object of the control circuit, the similar effects to the first to third embodiments are obtained.

In the first to third embodiments, the low heat resistance element 13 is a metal plate. Alternatively, the low heat resistance element 13 may be an element other than the metal plate, the element having a heat resistance lower than the insulation material and heat conductivity. For example, the low heat resistance element 13 may be a sheet including a resin film, gel, grease, adhesive or the like. Even when the low heat resistance element 13 is an element other than the metal plate, the heat resistance of the low heat resistance element 13 is lower than the multi-layer substrate 12 and the electric element 16. Thus, the similar effects to the first to third embodiments are obtained.

In the above disclosure, the insulation material may be any kind of resin having an insulation property. For example, the insulation material may be thermo plastic resin. The base part may be a plate shaped material made of insulation material. For example, the base part may be a film shaped member. As long as a conductor is formed on/in the base part, the base part may be any kind of material. The conductor may be a conductive member such as a conductor pattern, an interlayer connection member, a conductive material in a via hole. The number of base parts for providing the multi-layer substrate may be any. For example, the number of base parts may be a few tens such as fifty, which may be an upper limit. The multi-layer substrate may be a PALAP (i.e., patterned prepreg lay up process, that is a registered trade mark) or a multi-layer printed circuit board. The heat conducting member may be gel, grease, adhesive or sheet having heat conductivity. The heat conducting member may be made of any kind of material. The heat radiation body radiates heat. The heat radiation body may be a heat radiation plate or a heat sink. In general, the heat radiation body has conductivity. The heat radiation body may function as a heat conductive member for transmitting heat with a cooler or a heater. When the heat radiation body functions as the heat conductive member, the heat radiation efficiency of the structure may provide heat conductivity or heat conducting efficiency. The electric element or the electric device may be mounted on the multi-layer substrate or accommodated in the multi-layer substrate. For example, the electric element or the electric device may be a semiconductor device such as a switching element, a diode, a semiconductor relay and an IC. Alternatively, the electric element or the electric device may be a resistor, a capacitor, a coil, a reactor or the like. The low heat resistance element is made of material having the heat resistance lower than the insulation material. The feature that the height of the multi-layer substrate and the electric device are equalized in the heating and pressing process means a case where the height of the multi-layer substrate and the electric device are equal to each other, a case where the height of the multi-layer substrate and the electric device are substantially equal to each other within the manufacturing tolerance, or a case where the difference between the height of the multi-layer substrate and the electric device is adjusted by the thickness of the heat conducting member.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A heat radiation structure for an electric device comprising:
   at least one multi-layer substrate including a plurality of base parts made of insulation material and a conductor pattern, which are stacked in a multi-layer structure so that the conductor pattern is electrically coupled with an interlayer connection portion in the base parts;
   the electric device having at least one of a first electric element built in the at least one multi-layer substrate and a second electric element, which is not built in the multi-layer substrate; and
   a low heat resistance element opposed to the electric device,
   wherein the low heat resistance element has a heat resistance lower than the insulation material, and
   wherein the heat radiation structure further comprises: a circuit board disposed on the at least one multi-layer substrate opposite to the low heat resistance element,
   wherein the at least one multi-layer substrate includes a plurality of multi-layer substrates, which are arranged on the circuit board along a direction different from a stacking direction of each of the plurality of multi-layer substrates, and
   wherein heat generated at the first electric element in the at least one multi-layer substrate is radiated via the low heat resistance element to an outside of the heat radiation structure,
   wherein the base parts includes an insulation base part, which is opposed to the low heat resistance element,
   wherein the base parts further includes an adjacent base part, which is adjacent to the insulation base part,
   wherein the adjacent base part has a surface, which is opposed to the low heat resistance element, and
   wherein the conductor pattern is disposed on the surface of the adjacent base part.

2. The heat radiation structure according to claim 1, further comprising:
   a heat conducting member disposed between the low heat resistance element and a heat radiation body or between the at least one multi-layer substrate or the second electric element and the low heat resistance element,
   wherein the heat radiation body is disposed on an opposite side of the electric device.

3. The heat radiation structure according to claim 1, wherein the first electric element is accommodated in an accommodation portion of the at least one multi-layer substrate.

4. The heat radiation structure according to claim 1, wherein the first electric element has a thickness, which is equal to a thickness of each of the plurality of base parts.

5. The heat radiation structure according to claim 1, wherein:
   the at least one of the first electric element includes a plurality of first electric elements; and
   the plurality of first electric elements are disposed in a same one of the base parts.

6. The heat radiation structure according to claim 5, wherein:
   the plurality of first electric elements have a same thickness in the stacking direction.

7. The heat radiation structure according to claim 6, wherein:
   the same thickness of the plurality of first electric elements is equal to a thickness of the same one of the base parts in the stacking direction.

8. The heat radiation structure according to claim 1, wherein:
   the at least one of the first electric element is disposed on the adjacent base part opposed to the insulation base part.

9. The heat radiation structure according to claim 8, wherein:
   the insulation base part contacts the adjacent base part via the conductor pattern.

* * * * *